United States Patent
Huijsing et al.

(10) Patent No.: US 7,132,883 B2
(45) Date of Patent: Nov. 7, 2006

(54) CHOPPER CHOPPER-STABILIZED INSTRUMENTATION AND OPERATIONAL AMPLIFIERS

(75) Inventors: Johan Hendrik Huijsing, Schipluiden (NL); Behzad Shahi, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 80 days.

(21) Appl. No.: 11/055,123

(22) Filed: Feb. 8, 2005

(65) Prior Publication Data

US 2006/0176109 A1    Aug. 10, 2006

(51) Int. Cl.
*H03F 1/02* (2006.01)

(52) U.S. Cl. .......................................... 330/9; 327/124
(58) Field of Classification Search ................ 330/9, 330/124 R, 295, 292, 310; 327/124, 307
See application file for complete search history.

(56) References Cited

U.S. PATENT DOCUMENTS

| | | |
|---|---|---|
| 4,559,502 A | 12/1985 | Huijsing |
| 5,486,790 A | 1/1996 | Huijsing et al. |
| 6,456,159 B1 * | 9/2002 | Brewer ........................... 330/9 |
| 6,559,720 B1 | 5/2003 | Huijsing et al. |
| 6,734,723 B1 * | 5/2004 | Huijsing et al. ............... 330/9 |

OTHER PUBLICATIONS

Van Den Dool, Bernard J., et al., "Indirect Current Feedback Instrumentation Amplifier with a Common-Mode Input Range that Includes the Negative Rail", IEEE Journal of Solid-State Circuits, Jul. 1993, pp. 743-749, vol. 28, No. 7.
Huijsing, Johan H., "Operational Amplifiers Theory and Design", Mar. 2001, p. 408, Kluwer Academic Publishers.
Linear Technology Corporation, "LTC6800 Rail-to-Rail Input and Output, Instrumentation Amplifier", 2002, pp. 1-12.

* cited by examiner

*Primary Examiner*—Henry Choe
(74) *Attorney, Agent, or Firm*—Blakely Sokoloff Taylor & Zafman LLP (57) ABSTRACT

Chopper chopper-stabilized instrumentation and operational amplifiers having ultra low offset. The instrumentation amplifiers use current-feedback, and include, in addition to a main chopper amplifier chain, a chopper stabilized loop for correcting for the offset of the input amplifiers for the input signal and for receiving the feedback of the output voltage sense signal. Additional loops, which may include offset compensation and autozeroing loops, may be added to compensate for offsets in the chopper stabilized loop for correcting for the offset of the input amplifiers. Similar compensation is disclosed for decreasing the offset in operational amplifiers.

37 Claims, 7 Drawing Sheets

CHOPPER CHOPPER-STABILIZED INSTRUMENTATION AND OPERATIONAL AMPLIFIERS

BACKGROUND OF THE INVENTION

1. Field of the Invention

The present invention relates to the field of instrumentation amplifiers.

2. Prior Art

An Instrumentation Amplifier is often made up of 3 operational amplifiers (OpAmps). The first two amplifiers are buffer amplifiers. The third amplifier is an amplifier with a four-resistor bridge as a feedback network. This configuration has two main disadvantages: Firstly, the common-mode rejection ratio (CMRR) is limited by the unbalance of the resistive bridge. Secondly, the input voltage common-mode (CM) range cannot include the negative rail because of the overall feedback from the output to the input by the OpAmps ("Operational Amplifiers", Johan Huijsing, Kluwer Academic Publishers).

Figure 1:
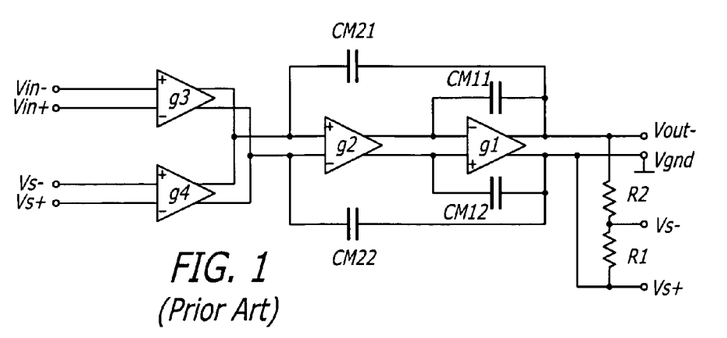
FIG. 1 is a block diagram of a prior art current-feedback instrumentation amplifier.

Therefore, the current-feedback instrumentation amplifier is a better alternative. Its topology is shown in FIG. 1. It is excellently suited to allow the negative or positive supply rail voltage to be included into the input common-mode range ("Indirect current feedback instrumentation amplifier with a common-mode input range that includes the negative rail", B. J. van den Dool et al., IEEE Journal of Solid State Circuits, Vol. 38, No. 7, July 1993, Pgs. 743–749). The reason is that the input signal and feedback signal are independently sensed by the voltage-to-current (V-I) converters $G_3$ and $G_4$. For instance, if these V-I converters are composed of identical differential P-channel pairs, the negative supply rail can be included. For obtaining a better accuracy and CMRR, the V-I converters can be each composed of two high-transconductance composite P-channel transistors with a degeneration resistor between the sources. This also improves the matching of the two identical transconductances $G_3$ and $G_4$ for better overall gain accuracy.

The instrumentation amplifier of FIG. 1 further consists of an output stage G1 and an intermediate stage G2. A nested Miller compensation with $C_{M11}$, $C_{M12}$, $C_{M21}$, $C_{M22}$ provides a preferred straight roll-off of the frequency characteristic.

Figure 2:
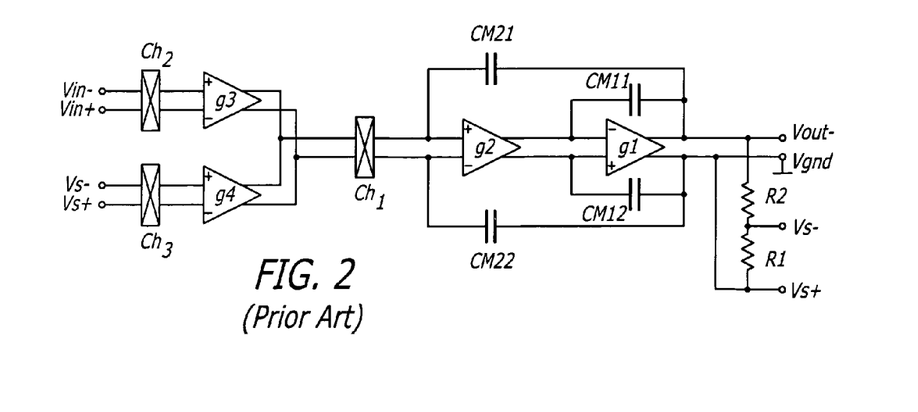
FIG. 2 is a block diagram of a prior art instrumentation amplifier like that of FIG. 1, though with choppers inserted in the signal path around the input stages.

To obtain low offset, choppers can be inserted in the signal path around the input stages, as shown in FIG. 2. With choppers, the offset can roughly be reduced by a factor 100–1000, from 10 mV to 100–10 µV. But there are several limitations. Firstly, a square wave at the chopper frequency of the size of the offset referred to the input will appear around the correct average signal value. To erase this square wave, a low-pass filter has to be placed after the instrumentation amplifier. This reduces the bandwidth of the instrumentation amplifier to below 0.1 (10%) of the chopper frequency. If the chopper frequency $F_1$ is 10 kHz, the bandwidth will be reduced to several hundreds Hz.

Figure 3:
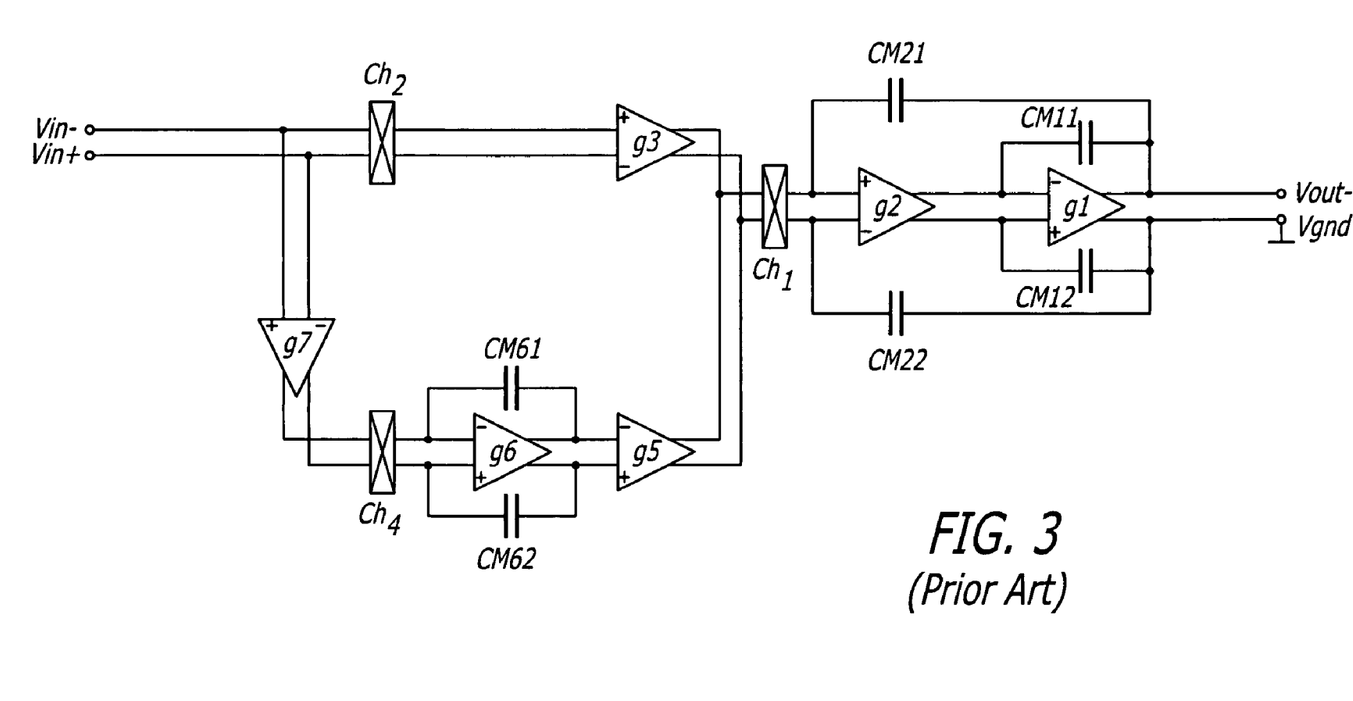
FIG. 3 is a block diagram of a prior art chopper-stabilized OpAmp.

Secondly, there are several effects that limit the offset reduction. One of them is an imperfect 50% duty cycle of the chopper frequency. Another is an unbalance of the charge injection in the choppers by the switching signal. Further, the initial offset will not fully be averaged out due to parasitic capacitors between the first chopper inputs in combination with attenuation resistors at the inputs. Most of these limitations, except charge injection, would vanish if the initial offset of the input amplifiers could be reduced by trimming or by autozeroing. Trimming is undesirable and not preferred in mass-production due to additional test time, cost and complexity, and lack of stability over temperature and time. One cannot simply autozero an instrumentation amplifier as was done in the prior art for OpAmps (U.S. Pat. No. 6,734,723, Huijsing et al.), because in accordance with FIGS. 1 and 2, the input voltage is not zero, but instead, the input stages carry the input and feedback voltages, respectively. In that regard, FIG. 3 presents a prior art chopper-stabilized OpAmp. Because an OpAmp is a high gain amplifier used with negative feedback, the closed loop differential input voltage to amplifier $g_3$ is zero, so that the input to chopper $Ch_2$ is simply the accumulated offsets of amplifiers $g_3$, $g_2$ and $g_1$ as referred to the input of amplifier $g_3$.

As used herein and in the disclosure and claims of the present invention to follow, the word stability and the various other forms of the word sometimes refer to stability in the sense of the absence of significant drift over time and temperature, not stability in the sense of absence of self oscillation or ringing, or hangup on either rail.

DETAILED DESCRIPTION OF THE PREFERRED EMBODIMENTS

Figure 4:
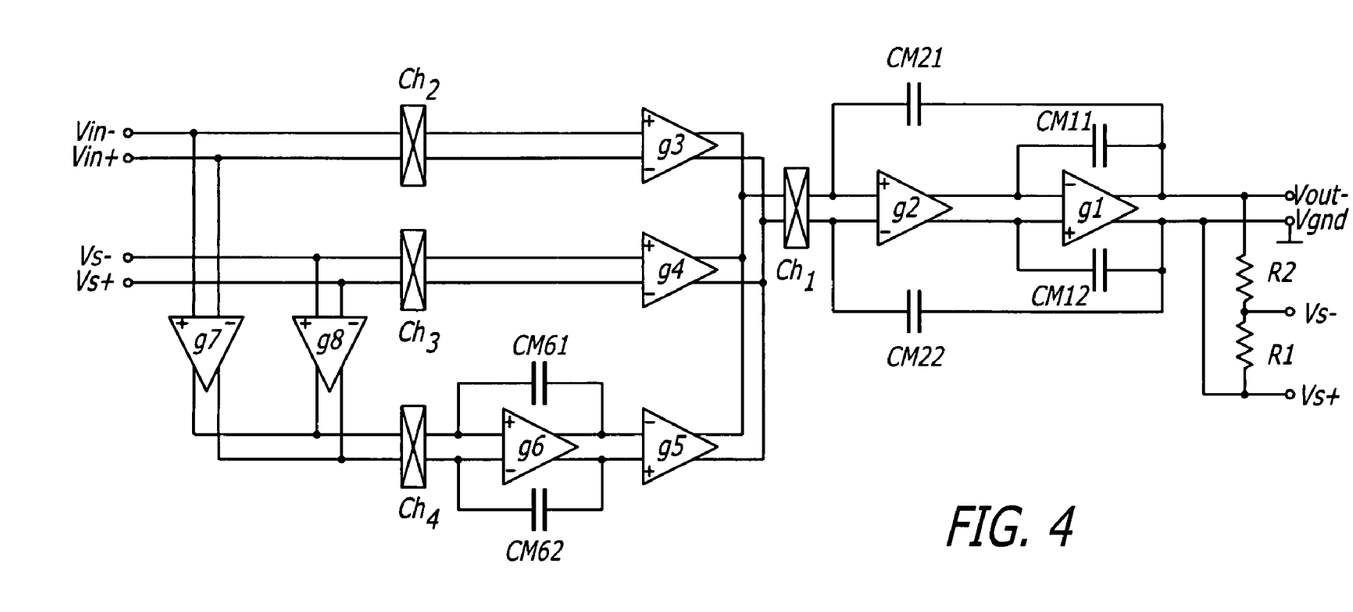
FIG. 4 is a block diagram of one embodiment of the present invention chopper chopper-stabilized current-feedback instrumentation amplifier.

One embodiment of the present invention is shown in FIG. 4. The basic chopper current-feedback instrumentation amplifier of FIG. 2 is used as the main instrumentation amplifier. The voltage-to-current converter $G_3$ senses the input signal $V_{in}=V_{in+}-V_{in-}$, while the voltage-to-current converter $G_4$ takes the sense feedback output signal $V_s=V_{s+}-V_{s-}$. If $G_3=G_4$, the high loop gain of the whole amplifier forces the feedback sense voltage $V_s$ to be equal and opposite to the input voltage $V_{in}$.

The choppers $Ch_1$, $Ch_2$ and $Ch_3$ chop the offset voltage of the amplifiers $G_3$ and $G_4$. The chopped offset can be regarded as a square-wave interference voltage referred to the input voltage of amplifiers $G_3$ and $G_4$. The input voltage $V_{in}$ is determined by an external source, and while generally may be a varying signal, it does not contain the square-wave signal. The high loop gain of the whole amplifier forces the feedback-sense voltage $V_s$ to compensate the chopped input offset voltage. Therefore, this square-wave chopped input offset will be superimposed on the desired feedback sense voltage $V_s$.

In the embodiment of FIG. 4, amplifiers $G_7$ and $G_8$ (voltage to current converters) are used to obtain a gauge to control the offset of amplifiers $G_3$ and $G_4$. More specifically, with respect to DC levels, the closed loop circuit settles with $V_{in}$ and $V_s$ being equal and opposite voltages. However the sense voltage $V_s$ has the offset caused square wave on it while $V_{in}$ does not. Consequently the output current of amplifier $G_7$ plus the output current of amplifier $G_8$ will simply be the square wave caused by the offset of amplifier $G_3$. Thus the resulting current represents the square-wave chopped input offset voltage component from $V_s$, and largely suppresses the desired input and feedback sense voltages.

Next the combined output currents of amplifiers $G_7$ and $G_8$ are rectified into a DC current by the chopper $Ch_4$. This DC current represents the input offset voltage. Next this DC current is integrated by an integrator amplifier $G_6$, with the integrator output voltage being converted into a current by $G_5$ and added to the output currents of amplifiers $G_3$ and $G_4$ in order to gradually cancel the input offset voltage of these amplifiers. Since the offsets are at most very slowly varying, such as by temperature or time variations, in general the response of this offset control loop need not be particularly fast, and generally is intentionally given a time constant much longer than the chopper frequency period so as to be a substantially fixed offset compensation during each chopper period. Note that the integrator has the effect of integrating the rectified square wave on the sense voltage $V_s$, no matter how small, so that, neglecting other sources of error, the offset control loop settles when the offset is eliminated, and is not limited to the gain within the control loop.

Figure 5:
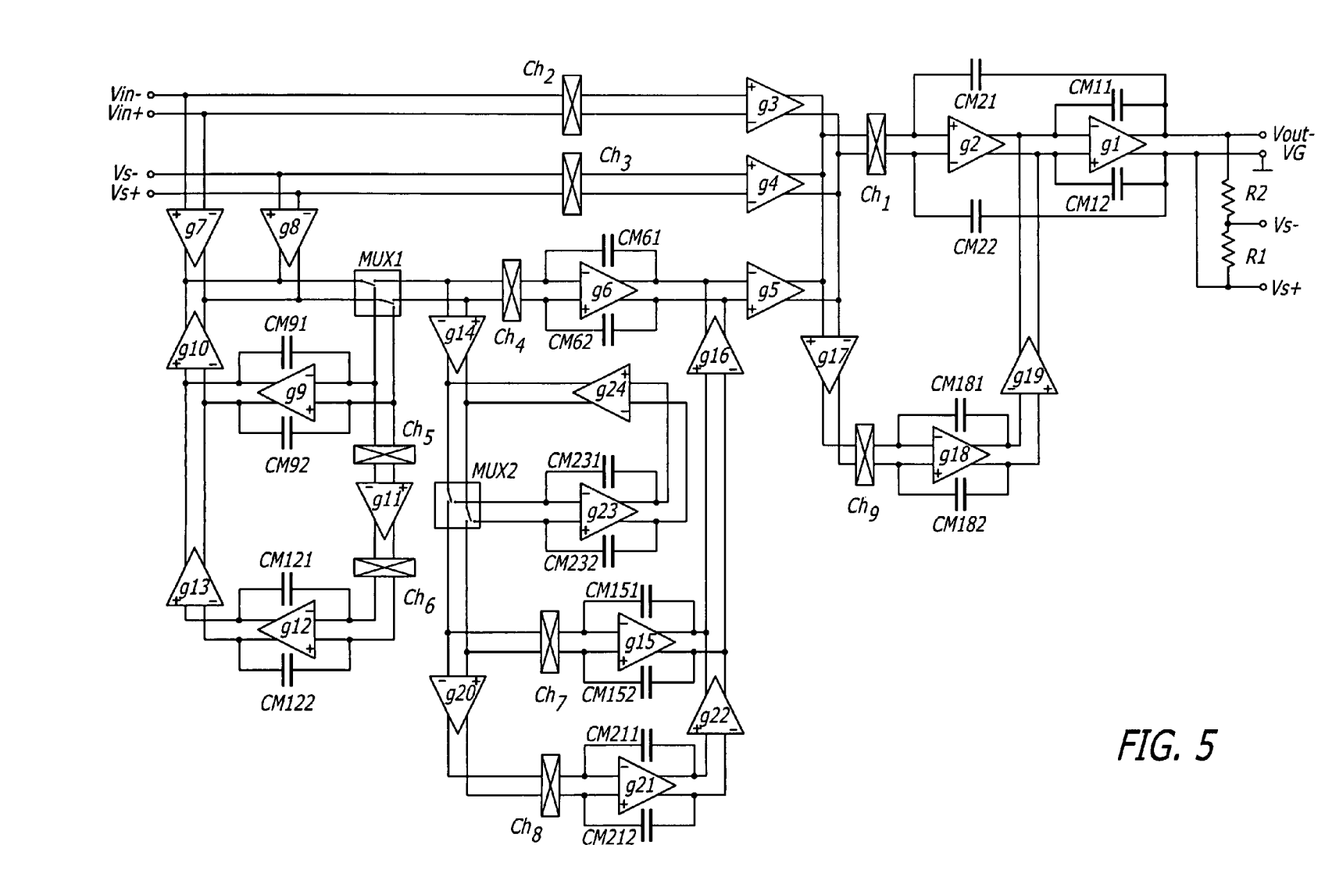
FIG. 5 is a block diagram of an embodiment similar to that of FIG. 4, but including further improvements in the chopper chopper-stabilized current-feedback instrumentation amplifier.

The chopper chopper-stabilized current-feedback instrumentation amplifier of FIG. 4 can still be improved on 3 issues. These further improvements are depicted in FIG. 5.

The sense amplifiers $G_7$ and $G_8$ each have an offset voltage. This offset is represented as an offset current at their output and further chopped by chopper $Ch_4$ (FIG. 4) into a square wave current. This current is integrated into a triangle shaped voltage by the integrator $G_6$ and added to the output by amplifier $G_5$. By chopper $Ch_3$, the triangle waveform is reshaped into a sawtooth referred to the feedback sense $V_s$. This is an undesired signal. Also the offset of amplifiers $G_7$ and $G_8$ together with an imperfection of the 50% duty cycle of chopper $Ch_4$ will result in a DC component, which cannot be distinguished from the offset of amplifiers $G_3$ and $G_4$. Therefore, the offset of $G_7$ and $G_8$ should be reduced.

Thus the first main improvement is to reduce the offset of amplifiers $G_7$ and $G_8$. Therefore, an autozero phase through multiplexer $MUX_1$ during one full clock cycle is introduced. In this phase the multiplexer allows the output of amplifiers $G_7$ and $G_8$ to be integrated by amplifier $G_9$. The amplifier $G_{10}$ feeds the integrated offset back and corrects for it.

The offset of amplifier $G_9$ should be low because it builds charge across the parasitic capacitances at the output of amplifiers $G_{7,8}$, which will later be discharged by a different offset of the integrator $G_6$. This results in an incorrect sensing of the offset of amplifiers $G_3$ and $G_4$, similar to the offset of amplifier $G_6$, as described hereinafter, and a square wave residue. To reduce the offset of amplifier $G_9$, a chopper stabilisation loop is built around it consisting of the choppers $Ch_5$ and $Ch_6$, the sense amplifier $G_{11}$, the integrator $G_{12}$ and correction amplifier $G_{13}$.

If integrator $G_6$ has an input offset voltage, this voltage will show as a square wave before the chopper $Ch_4$. This will charge and discharge the parasitic capacitors at the output of amplifiers $G_7$ and $G_8$. These charge pulses will be integrated into a DC voltage by integrator $G_6$. This DC voltage cannot be distinguished from the DC integrator voltage that represents the offset of amplifiers $G_3$ and $G_4$. As a result, the offset of amplifiers $G_3$ and $G_4$ is not compensated correctly, and a square wave by the choppers $Ch_2$ and $Ch_3$ will remain. Therefore, the offset of integrator $G_6$ has to be reduced.

Thus the second main improvement is to reduce the offset of amplifier $G_6$. For that purpose, a secondary offset detection and correction circuit has been added similar to the circuitry $G_8$, $Ch_4$, $G_6$, $G_5$. The secondary offset sense and correction loop consists of a sense amplifier $G_{14}$, a chopper $Ch_7$, an integrator $G_{15}$ and a correction amplifier $G_{16}$. The sense amplifier $G_{14}$ senses the square wave before chopper $Ch_4$ caused by the offset of amplifier $G_6$. Chopper $Ch_7$ redirects the square wave and the integrator $G_{15}$ integrates the offset caused by amplifier $G_6$. The correction amplifier $G_{16}$ closes the loop.

However, this secondary loop also needs a third order correction. Firstly, the offset of amplifier $G_{14}$, being chopped by $Ch_7$, creates a triangle wave at the output of the integrator $G_{15}$. This triangle is added through amplifiers $G_{16}$ and $G_5$ and referred to the feedback input through amplifiers $G_{3,4}$ and chopper $Ch_3$ as a sawtooth waveform. This is undesirable. Therefore, an autozero loop has been placed around amplifier $G_{14}$ through multiplexer $MUX_2$, integrator $G_{23}$ and correction amplifier $G_{24}$. This is similar to $MUX1$, integrator $G_9$ and correction amplifier $G_{10}$, to correct the offset of amplifiers $G_7$ and $G_8$.

The offset of integrator $G_{15}$ introduces a square wave before chopper $Ch_7$. The parasitic output capacitance at the output of amplifier $G_{14}$ creates charge pulses, which are rectified by chopper $Ch_7$ and integrated again by integrator $G_{15}$ into an incorrect correction signal, which looks like an offset of the original integrator $G_6$, resulting in a square wave residue. Therefore, another or third order correction loop is created to correct the offset of amplifier $G_{15}$. This loop consists of the sense amplifier $G_{20}$, chopper $Ch_8$, integrator $G_{21}$, and correction amplifier $G_{22}$.

Finally, the offset of amplifier $G_2$ in the main amplifier will show as an input offset, but reduced by the voltage gain of amplifiers $G_3$ and $G_4$. If the offset of amplifier $G_2$ is 10 mV, and the voltage gain of amplifiers $G_3$ and $G_4$ is 1000, there still is an offset of 10 µV. Hence it is good to also reduce the offset of amplifier $G_2$.

Moreover, the offset of amplifier $G_2$ results in charge peaks introduced by the parasitic capacitances at the output of amplifiers $G_3$, $G_4$ and $G_5$ in combination with the chopping activity of chopper $Ch_1$. Also for this purpose, it is desirable to reduce the offset of amplifier $G_2$.

The offset of amplifier $G_2$ results in a residual offset and spikes. Therefore, a sense and correction loop is built around amplifier $G_2$, consisting of a sense amplifier $G_{17}$, chopper $Ch_9$, integrator $G_{18}$, and correction amplifier $G_{19}$. This is similar as the loop formed by amplifiers $G_{8,9}$, chopper $Ch_4$, integrator $G_6$ and correction amplifier $G_5$.

Figure 6:
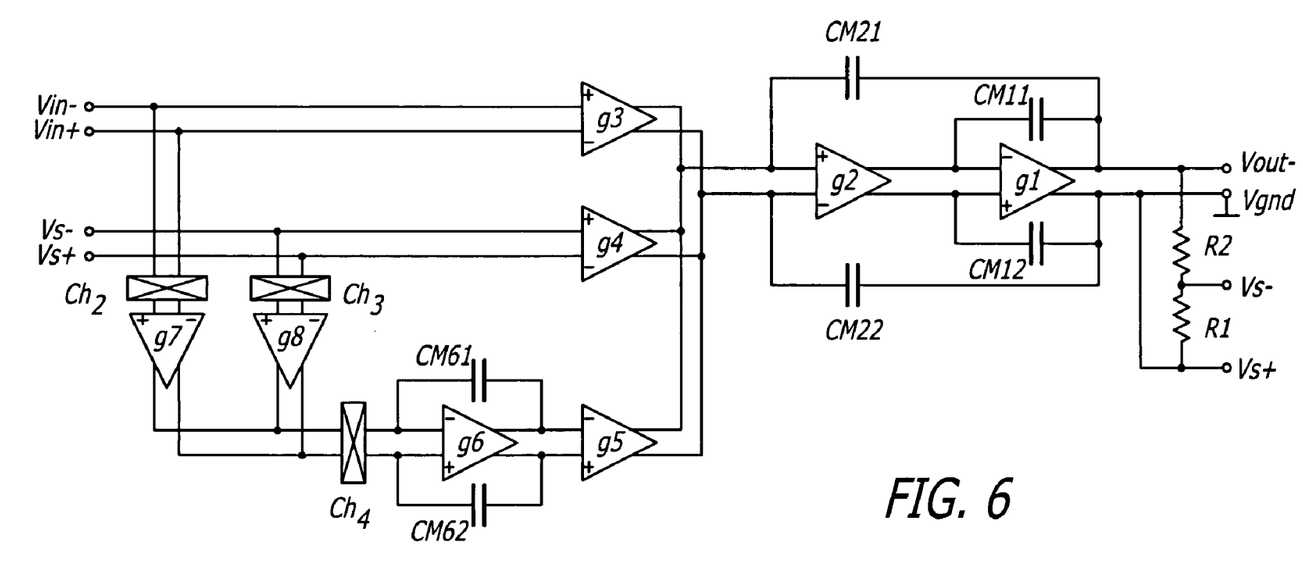
FIG. 6 is a block diagram of another embodiment of chopper-stabilized current-feedback instrumentation amplifier.

It appears possible to simplify the methods hereinbefore described for use in chopper-stabilized amplifiers. A basic architecture for a chopper-stabilized current-feedback instrumentation amplifier is shown in FIG. 6. Because there are no choppers in the main feed forward signal path, no square-wave offset related signal can be found at the input voltage VS of amplifier $G_4$, though the offsets are still present.

However, using choppers $Ch_2$ and $Ch_3$ to chop the input voltage $V_{in}$ and feedback sense voltage $V_s$, and converting the $G_8$ and subtracting the output currents of amplifiers $G_7$ and $G_8$ ($V_{in}$ and $V_s$ are equal and opposite differential voltages), a current signal representing the chopped offset of amplifiers $G_3$ and $G_4$ is obtained. Chopping this again by chopper $Ch_4$, a DC signal representing the offset of $G_3$ and $G_4$ is obtained. Integrating this signal by integrator $G_6$ and adding it by a correction amplifier $G_5$ to the output summing node of amplifiers $G_3$ and $G_4$ compensates for the offset.

There is one drawback in regard to the chopper chopper-stabilized version of FIG. 6 however. Specifically, if the gains of amplifiers $G_7$ and $G_8$ are not equal, DC input signals at $V_{in}$ and $V_s$ cannot be distinguished from the offset. Thus the offset correction is DC signal dependent.

This can also be interpreted as a gain error $\Delta A = G_{7/8} - G_{3/4}$ at very low frequencies, where the gain of the correction path through $G_7$ and $G_8$ and $G_6$ and $G_5$ dominates the gain of the straight path through $G_3$ and $G_4$. But these drawbacks may be overcome by auto-trimming or by dynamic-element matching techniques.

Figure 7:
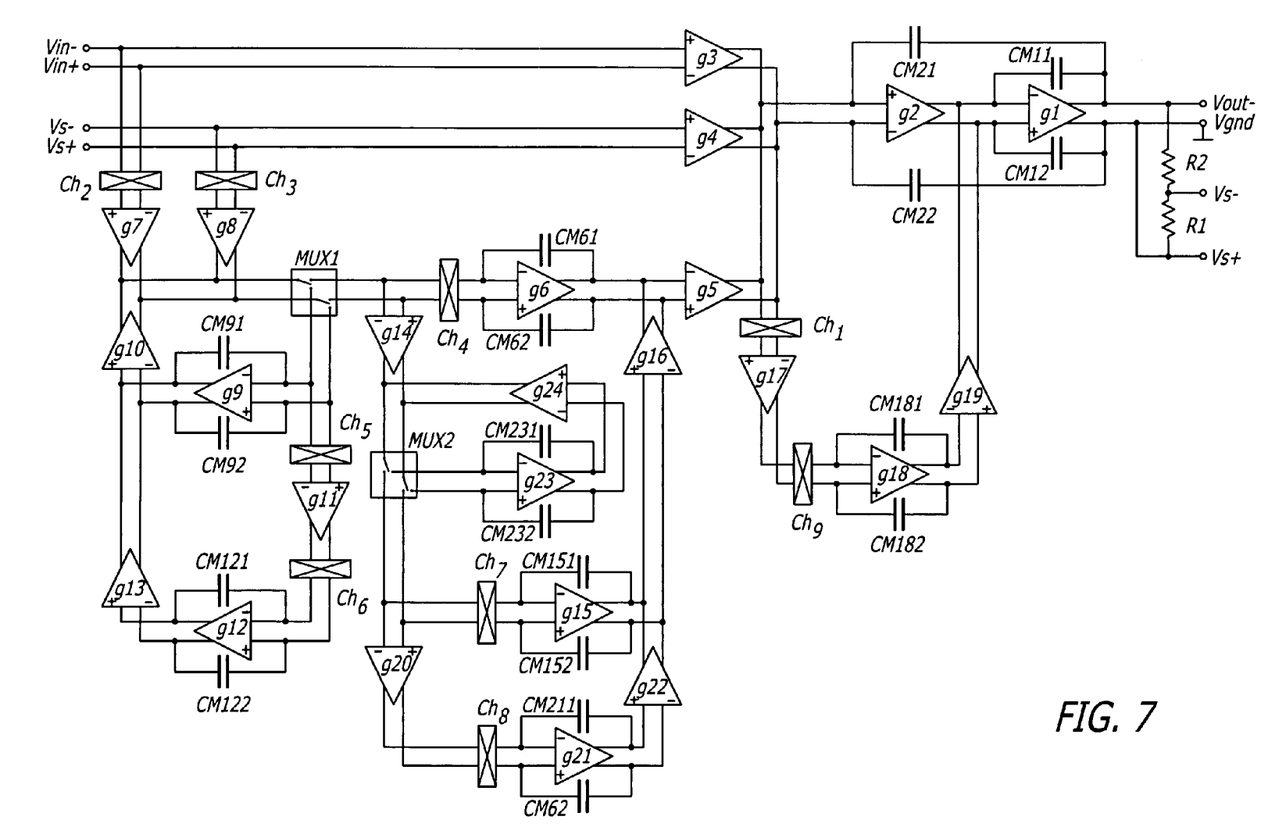
FIG. 7 is a block diagram of an embodiment similar to that of FIG. 6, but including further improvements in the chopper chopper-stabilized current-feedback instrumentation amplifier similar to the improvements in the embodiment of FIG. 5.

In the same way as the basic chopper chopper-stabilized instrumentation amplifier of FIG. 4 was further improved by second-order and third-order correction loops, the chopper stabilized current-feedback instrumentation amplifier of FIG. 6 can be further if improved. This is shown in FIG. 7. Most of the correction loops have been described with respect to FIG. 5. The multiplexer MUX1 together with amplifiers $G_9$ and $G_{10}$ autozero amplifiers $G_7$ and $G_8$, while chopper $Ch_5$, amplifier $G_{11}$, chopper $Ch_6$, integrator $G_{12}$, and amplifier $G_{13}$ chopper stabilize integrator $G_9$. Similarly, amplifier $G_{14}$, chopper $Ch_7$, integrator $G_{15}$ and amplifier $G_{16}$ chopper-stabilize integrator $G_6$, while multiplexer MUX2, integrator $G_{23}$ and amplifier $G_{24}$ autozero amplifier $G_{14}$, and also amplifier $G_{20}$, chopper $Ch_8$, integrator $G_{21}$ and amplifier $G_{22}$ chopper-stabilize amplifier $G_{15}$. The main purpose of the loop around amplifier $G_2$ in FIG. 5 was to reduce the offset of amplifier $G_2$ so that spikes caused by chopper $Ch_1$ were reduced.

Now that chopper $Ch_1$ of FIGS. 3 and 4 has been removed in FIG. 7, the chopper-stabilized loop around $G_2$ might not be necessary anymore. But if in any case this loop is still desired, for instance to reduce the effect of offset of amplifier $G_2$ on the input, chopper $Ch_1$ now needs to be placed inside the correction loop together with amplifier $G_{17}$, chopper $Ch_9$, integrator $G_{18}$ and amplifier $G_{19}$, as shown in FIG. 7.

Figure 8:
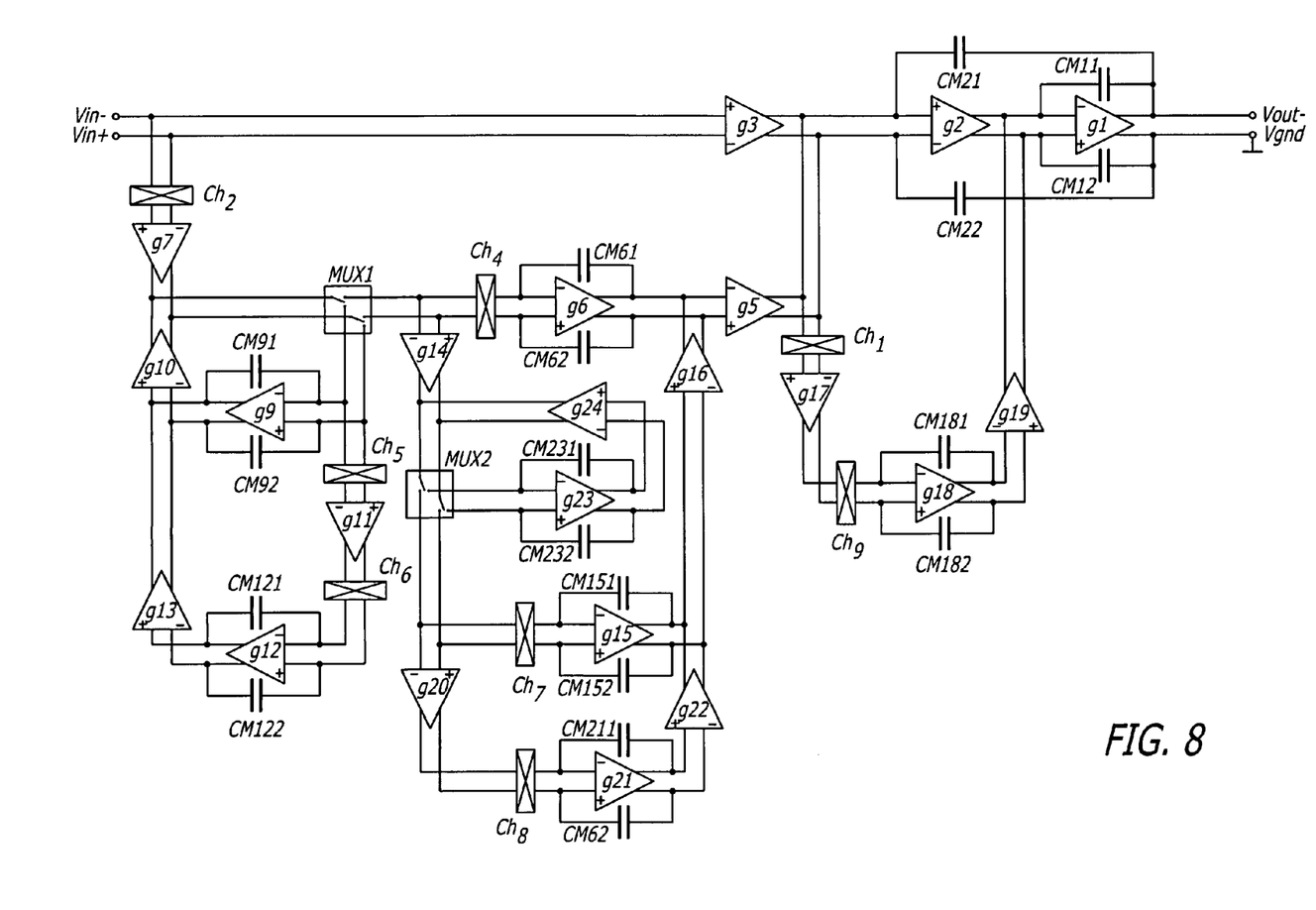
FIG. 8 is a block diagram of an improved chopper-stabilized OpAmp.

The instrumentation amplifier of FIG. 7 can be reduced to an OpAmp by eliminating amplifier $G_4$, chopper $Ch_3$ and OpAmp of FIG. 8. In that regard, the operation of the circuit is identical to that explained with respect to FIG. 7 with the exception that because it is used as an OpAmp, as explained before, in use, the negative feedback will force the differential input to $V_{in}$ to zero, so that the only DC component in the input $V_{in}$ will be the accumulated offsets of amplifiers $g_3$, $g_2$ and $g_1$ as referred to the input of amplifier $g_3$. Consequently cancellation of the DC component of the input signal required in instrumentation amplifiers and accomplished by amplifier $G_4$, chopper $Ch_3$ and amplifier $G_8$ in FIG. 7 is not required in the OpAmp of FIG. 8.

Thus there has been disclosed herein ultra low offset, low spike artifact instrumentation amplifiers that have a main chopper amplifier chain (backwards numbered) amplifiers $G_1$ and $G_2$, chopper $Ch_1$, amplifiers $G_{3,4}$ and chopper $Ch_{2,3}$, with a first order offset cancellation loop with amplifier $G_5$, integrator $G_6$, chopper $Ch_4$ and amplifiers $G_{7,8}$. Also disclosed as possible improvements are up to three second-order cancellation loops comprising; multiplexer MUX1, integrator $G_9$ and amplifier $G_{10}$; amplifier $G_{14}$, chopper $Ch_7$, integrator $G_{15}$ and amplifier $G_{16}$; and amplifier $G_{17}$, chopper $Ch_9$, integrator $G_{18}$ and amplifier $G_{19}$. Further disclosed as possible improvements are up to three third order cancellation loops; chopper $Ch_5$, amplifier $G_{11}$, chopper $h_6$, integrator $G_{12}$ and $G_{24}$; and amplifier $G_{20}$, chopper $Ch_8$, integrator $G_{21}$ and amplifier $G_{22}$.

Further disclosed is the application of the inventive aspects of the present invention chopper-stabilized current-feedback instrumentation amplifiers to chopper-stabilized OpAmps. The exemplary embodiments are described with respect to differential amplifiers, though may be realized as single ended amplifiers also, that is, as single input, single output amplifiers. Also in the embodiments disclosed, two output stages are shown, though in some cases, such as in the case of amplifiers that are lightly loaded, a single stage may be used, dispensing with the use of amplifier $G_2$ and Miller compensation capacitors $CM_{21}$ and $CM_{22}$. Also amplifier G5 may be an attenuator, either an amplifier with a gain of less than one, or simply resistors for converting the integrator output to a current for input to the current summing point or for attenuation. Additional Miller compensated, nested amplifiers may also be incorporated as desired. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of amplification comprising:
   a) amplifying an amplifier input signal and a sense voltage feedback signal and adding the amplified signals;
   b) amplifying the added signal to provide an amplifier output;
   c) attenuating the amplifier output to provide a sense voltage feedback signal;
   d) chopping and amplifying the input signal and the sense voltage feedback signal, and adding the result;
   e) chopping the result in d) and integrating the chopped result by a first integrator; and,
   f) adding a signal responsive to the result of the integration in e) with the signals added in a).

2. The method of claim 1 wherein the amplifying in b) comprises two cascaded stages of amplification, each stage having Miller compensation from the amplifier output in b) to an input of the respective stage.

3. The method of claim 1 wherein the signals as added in a) and the signals added in f) are currents added by coupling respective currents to a current summing point.

4. The method of claim 1 wherein the result of integration in e) is amplified or attenuated before the adding in f).

5. The method of claim 1 wherein in d), amplifiers used for the amplifying are autozeroed by a second order loop.

6. The method of claim 5 wherein the autozeroing at least comprises an amplifier coupled as a second integrator, and further comprising chopper stabilizing the amplifier coupled as the second integrator.

7. The method of claim 6 wherein the autozeroing further comprises a correction amplifier having an input coupled to an output of the second integrator and having an output added with the result in d).

8. The method of claim 1 or 5 further comprised of detecting and correcting the offset of the amplifier connected as the first integrator with a secondary offset correction loop.

9. The method of claim 8 wherein the secondary offset correction loop includes a sense amplifier having an input coupled to the input of the chopper used in e), and further comprising autozeroing the sense amplifier.

10. The method of claim 9 wherein the secondary offset correction loop includes an amplifier coupled as a third integrator, and detecting and correcting the offset of the amplifier connected as the third integrator with a third order offset correction loop.

11. The method of claim 1 wherein the amplification in b) includes sensing and correcting the offset of at least a first stage of the amplification.

12. The method of claim 5 wherein the amplification in first stage of the amplification.

13. The method of claim 8 wherein the amplification in b) includes sensing and correcting the offset of at least a first stage of the amplification.

14. The method of claim 1 wherein the amplifying in b) comprises two stages of amplification, each stage having Miller compensation from the amplifier output in b) to an input of the respective stage.

15. A method of amplification comprising:
a) chopping an input signal;
b) chopping a sense voltage feedback signal;
c) amplifying and adding the chopped signals of a) and b);
d) chopping the added signal of c) and amplifying the chopped signal to provide an amplifier output;
e) attenuating the amplifier output to provide a sense voltage feedback signal;
f) amplifying the input signal and the sense voltage feedback signal and adding the result;
g) chopping the result in f) and integrating the chopped result by an amplifier coupled as a first integrator; and,
h) adding a signal responsive to the result of the integration to the signals added in c).

16. The method of claim 15 wherein the amplifying in d) comprises two stages of amplification, each stage having Miller compensation from the amplifier output in d) to an input of the respective stage.

17. The method of claim 15 wherein the signals as amplified in c) and the signals added in h) are currents added by coupling to a summing point.

18. The method of claim 15 wherein the result of integration in g) is amplified or attenuated before adding in h).

19. The method of claim 15 wherein in f), amplifiers used for the amplifying are autozeroed.

20. The method of claim 19 wherein the autozeroing includes an amplifier coupled as a second integrator.

21. The method of claim 20 further comprising chopper stabilizing the amplifier coupled as the second integrator.

22. The method of claim 15 or 19 further comprised of detecting and correcting the offset of the amplifier connected as the first integrator with a secondary offset correction loop.

23. The method of claim 22 wherein the amplification in d) includes sensing and correcting the offset of at least a first stage of the amplification.

24. The method of claim 22 wherein the secondary offset correction loop includes a sense amplifier having an input coupled to the input of the first integrator through the chopper of g), and further comprising autozeroing the sense amplifier.

25. The method of claim 24 wherein the secondary offset correction loop includes an amplifier coupled as a third integrator.

26. The method of claim 25 further comprising correcting the offset of the amplifier connected as the third integrator with a third order offset correction loop.

27. The method of claim 25 wherein the amplification in d) includes sensing and correcting the offset of at least a first stage of the amplification.

28. A method of amplification comprising:
a) amplifying an amplifier input signal and adding the result with an offset compensation signal to provide an added signal;
b) amplifying the added signal of a) to provide an amplifier output;
c) chopping and amplifying the amplifier input signal;
d) chopping the result in c) and integrating the chopped result, the integration being done with an amplifier coupled as a first integrator, and detecting and correcting the offset of the amplifier of the first integrator with a secondary offset correction loop;
e) providing as the offset compensation signal of a), a signal responsive to the result of the integration in d);
f) autozeroing the amplifier used in c), the autozeroing including an amplifier coupled as a second integrator.

29. The method of claim 28 further comprising chopper stabilizing the amplifier of the second integrator.

30. The method of claim 28 wherein the secondary offset correction loop includes a sense amplifier having an input coupled to the input of a chopper used in d), and autozeroing the sense amplifier.

31. The method of claim 28 wherein the secondary offset compensation loop has an amplifier coupled as a third integrator, and correcting the offset of the amplifier of the third integrator with a third order offset compensation loop.

32. The method of claim 29 wherein the secondary offset correction loop includes a sense amplifier having an input coupled to the input of a chopper used in d), and autozeroing the sense amplifier.

33. The method of claim 29 wherein the secondary offset compensation loop has an amplifier coupled as a third integrator, and correcting the offset of the amplifier of the third integrator with a third order offset compensation loop.

34. The method of claim 28, 29, 30, 31, 32 or 33 wherein the amplifying in b) comprises two stages of amplification, each stage having Miller compensation from the amplifier output in b) to an input of the respective stage.

35. The method of claim 34 wherein the amplification in b) comprises sensing and correcting the offset of at least a first stage of the amplification.

36. The method of claim 28 wherein the signals as added in a) are currents added by coupling respective currents to a current summing point.

37. The method of claim 28 wherein the result of integration in d) is amplified before the adding in a).

* * * * *